United States Patent
Chen

(10) Patent No.: US 7,227,386 B2
(45) Date of Patent: Jun. 5, 2007

(54) PHASE LOCKED LOOP LOCK-DETECTION CIRCUIT

(75) Inventor: Chung-Hui Chen, Hsin Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 77 days.

(21) Appl. No.: 10/792,006

(22) Filed: Mar. 3, 2004

(65) Prior Publication Data

US 2005/0195040 A1   Sep. 8, 2005

(51) Int. Cl.
G01R 25/00 (2006.01)
(52) U.S. Cl. ............................................. 327/12; 327/3
(58) Field of Classification Search ................ 331/1 A, 331/DIG. 2; 327/141, 142, 147, 156, 163, 327/2–3, 12
See application file for complete search history.

(56) References Cited

U.S. PATENT DOCUMENTS

| | | | | |
|---|---|---|---|---|
| 4,272,712 A | * | 6/1981 | Beling et al. ................ 318/696 |
| 4,437,072 A | * | 3/1984 | Asami .......................... 331/17 |
| 4,691,385 A | * | 9/1987 | Tupman ...................... 398/109 |
| 4,829,542 A | * | 5/1989 | Shibano ....................... 375/280 |
| 5,686,864 A | * | 11/1997 | Martin et al. ................ 331/1 A |
| 5,889,439 A | * | 3/1999 | Meyer et al. .................. 331/17 |
| 6,323,692 B1 | * | 11/2001 | Tsinker ......................... 327/12 |
| 6,396,354 B1 | | 5/2002 | Murayama et al. ........... 331/17 |
| 6,429,901 B1 | | 8/2002 | Kiyose et al. ............... 348/500 |
| 6,566,920 B1 | * | 5/2003 | Kim ............................ 327/147 |

* cited by examiner

Primary Examiner—Timothy P. Callahan
Assistant Examiner—Cassandra Cox
(74) Attorney, Agent, or Firm—Duane Morris LLP

(57) ABSTRACT

An improved clock lock detection circuit is disclosed. The circuit has a first input indicating an edge of a first clock and a second input indicating a corresponding edge of a second clock wherein the second clock is expected to be synchronized with the first clock with an allowable time difference. Further, it has a difference generation module for generating a difference signal based on the time difference between the first and second inputs, and a voltage divider module for receiving the difference signal and generating an indication voltage which varies based on a change of the time difference between the first and second inputs.

17 Claims, 3 Drawing Sheets

PHASE LOCKED LOOP LOCK-DETECTION CIRCUIT

BACKGROUND

The present disclosure relates generally to electronic circuits, and more particularly, to phase locked loop circuits. Still more particularly, the present disclosure relates to methods for detecting locks in a phase locked loop.

Phase locked loops (PLLs) are widely used in electronic designs such as radios, television receivers, video apparatuses, satellite broadcasts and instrumentation systems. PLLs are electronic circuits with a voltage or current-driven oscillator that is constantly driven to match the frequency of an input signal. Typically, a PLL circuit includes a voltage control oscillator (VCO) that first tunes a circuit frequency close to the desired frequency. A lock detection circuit then sends information signals to VCO such that VCO can re-adjust and lock in the frequency. If VCO overcompensates, the lock detection circuit re-adjusts the signal sent to VCO. In other words, VCO and the lock detection circuit work together through feedbacks to and from each other.

Among the purposes of a lock detection circuit in electronic designs are: to evaluate the quality of the output information, and to deliver out-of-lock rate information to the underlying electronic circuit such that bandwidth of the PLL can be readjusted appropriately. Lock detection is based on a number of variables, including but not limited to: time derivative, or the out-of-phase radians per unit time, the variance of the phase error, and cycle slips.

Depending on application areas and desired phase locking characteristics, phase locked loop detection may be implemented in a variety of circuits, including analog-only circuits, or mixed signal (analog/digital) circuits. Typically, lock detection is based on time derivative, measurable by the time delay between a rising edge of an input signal, and a rising edge of a carrier signal, and relative to the cycle time of the latter. Such a lock detection setup typically includes a phase-and-frequency detector (PFD), which delivers lock detection information such as the time delay between the rising edges of an input signal and a carrier signal.

PFD also delivers information with respect to momentary phase error in the form of pulse widths. A subsequent analysis of the said pulse widths and their corresponding pulse energies may yield information as to whether the one signal is locked against the other. Momentary pulse energy levels may also be averaged over time to yield a smoother value that can be compared against a threshold value by presetting the threshold value in a voltage comparator such as a Schmitt trigger and comparing the average value against the threshold value.

PFD also delivers information critical to understanding cycle slip, which is phase shift equal to one or a multiple of a carrier frequency's period. Cycle slip happens when a weak or noisy signal causes a change in the signal tracking point of the carrier frequency, thereby temporarily losing lock.

Desirable in the art of semiconductor memory design are improved designs and methods with which better control of lock detection in PLL circuits can be achieved.

SUMMARY

In view of the foregoing, this disclosure provides a system and a method with which better control of lock detection in PLL circuits can be achieved.

An improved clock lock detection circuit is disclosed. In one example, the circuit has a first input indicating an edge of a first clock and a second input indicating a corresponding edge of a second clock wherein the second clock is expected to be synchronized with the first clock with an allowable time difference. Further, it has a difference generation module for generating a difference signal based on the time difference between the first and second inputs, and a voltage divider module for receiving the difference signal, and generating an indication voltage which varies based on a change of the time difference between the first and second inputs.

In one example, a phase lock loop circuit is also provided with a clock lock detection module for detecting time delay between a first input signal and a second input signal, wherein the phase lock loop circuit includes a first flip-flop which is clocked by a first clock to generate the first input signal that is connectable to one input of a reset signal generator. A second flip-flop is clocked by a second clock to generate the second input signal that is connectable to the reset signal generator which provides the reset signal to the two flip-flops. The clock lock detection module further includes a difference generation module for generating a difference signal based on the time difference between the first and second signals, a voltage divider module containing a capacitor for receiving the difference signal and generating an indication voltage which varies due to a charging and discharging process of the capacitor influenced by a change of the time difference between the first and second signals. It may further include a voltage comparator for comparing the indication voltage against a predetermined threshold voltage for generating a lock signal indicating whether the time difference is within the allowable time difference.

Various aspects and advantages will become apparent from the following detailed description, taken in conjunction with the accompanying drawings, illustrating by way of example the principles of the disclosure.

DESCRIPTION

Figure 1:
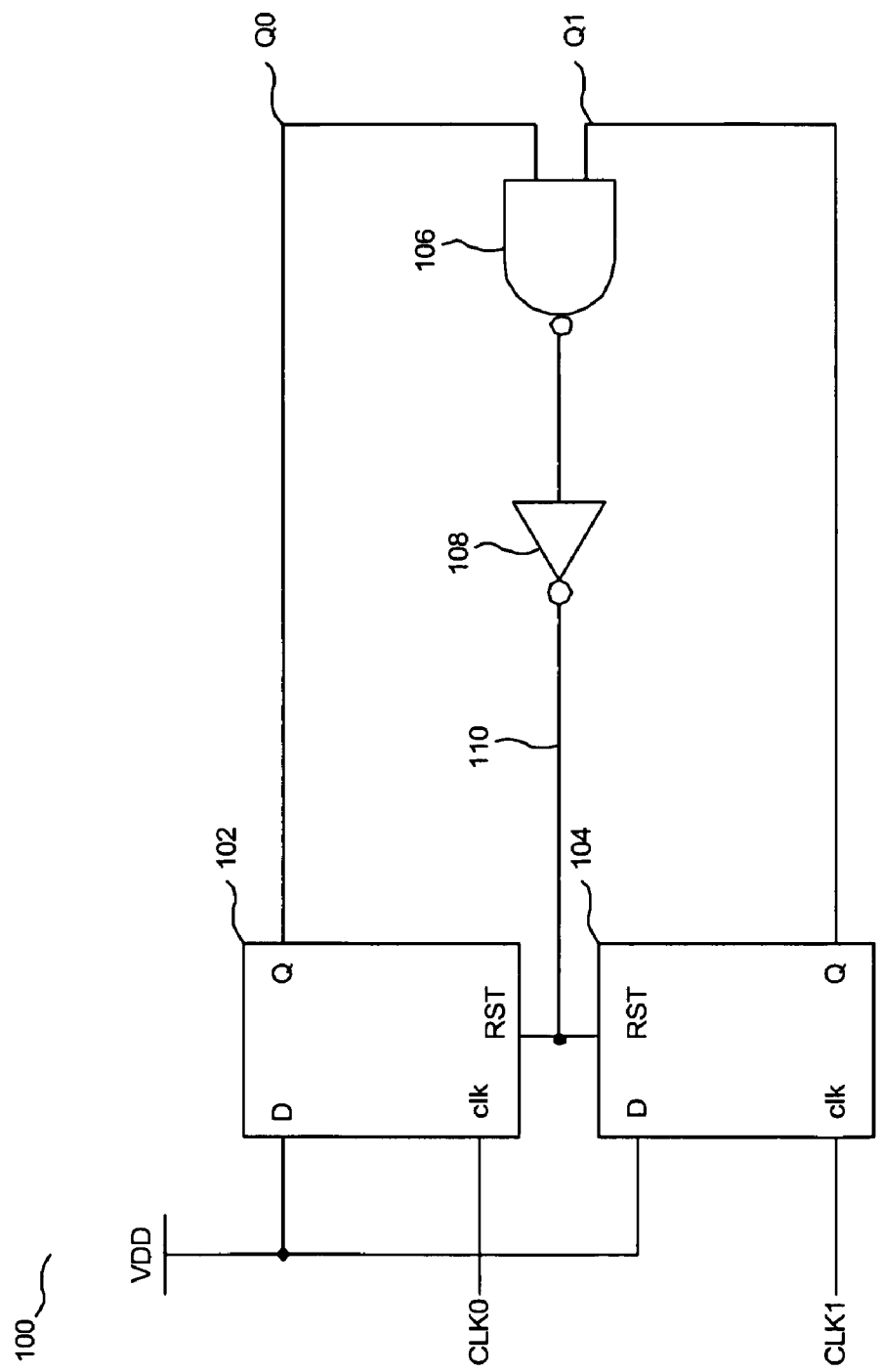
FIG. 1 illustrates a phase-and-frequency detection module in accordance with one example of the present disclosure.

In the present disclosure, a lock detection circuit and a method to operate the same are disclosed. In FIG. 1, a schematic of a phase-and-frequency detection module 100 is presented. The phase-and-frequency detection module 100 includes two D flip-flops 102 and 104, which are clocked to CLK0 and CLK1, respectively. The output of D flip-flop 102 is Q0, which is connected to one input terminal of a two-input NAND gate 106. The output of D flip-flop 104 is Q1, which is connected to another input terminal of the NAND gate 106. The output of NAND gate 106 is connected to an inverter 108, whose output, a reset signal 110, is connected to the reset terminals of the two D flip-flops 102 and 104. Finally, the input terminals of D flip-flops 102 and 104 are connected to VDD. Q0 goes high when CLK0 goes high. Similarly, Q1 goes high when CLK1 goes high.

If CLK0 and CLK1 are out of phase and CLK0 is leading CLK1, Q0 will go high first and when Q1 goes high, reset signal 110 goes high after some delays, thereby resetting Q0 and Q1 to low. The delays are gate delays and transmission delays that are usually very small. Reset signal 110 goes low when both Q0 and Q1 are reset after some delays. Q0, Q1 and reset signal 110 remain low until the next clock cycle repeats.

Figure 2:
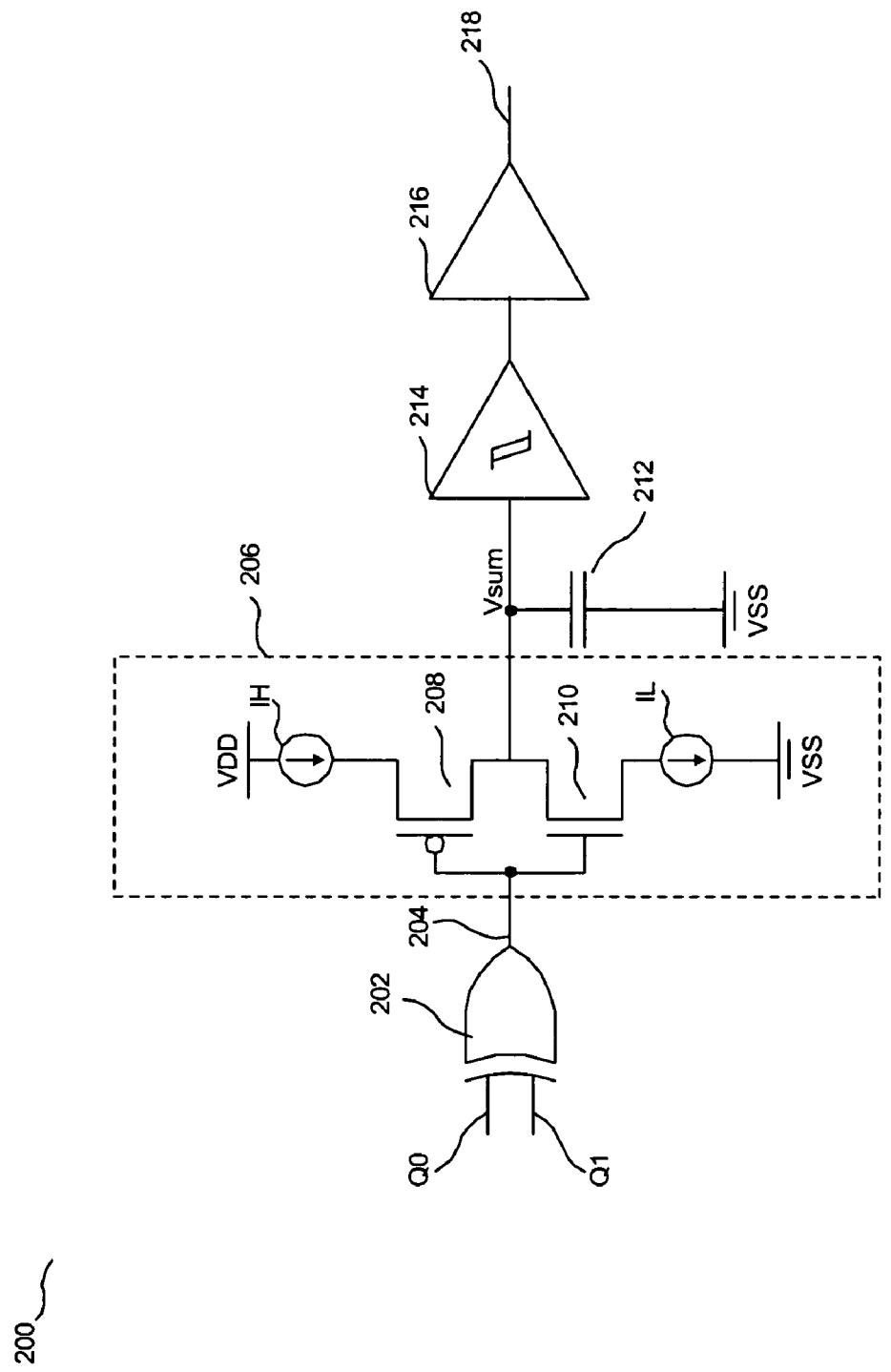
FIG. 2 illustrates a locking module in accordance with one example of the present disclosure.

FIG. 2 presents a schematic of a locking module 200. With reference to both FIGS. 1 and 2, locking module 200 includes a difference generation module such as two-input XOR gate 202, whose inputs are connected to Q0 and Q1. XOR gate 202 gives an output signal (a difference signal) 204, which is fed into a current controlled inverter 206. The output signal 204 indicates the time difference between Q0 and Q1. The current controlled inverter 206 has a pMOS transistor 208, whose source is optionally connected to a current source IH and further connected to VDD, and whose drain is optionally connected to the drain of an nMOS transistor 210, whose source is further connected to a current source IL and further connected to VSS. The gates of pMOS transistor 208 and nMOS transistor 210 are connected together, and further connected to the output signal 204. The drains of pMOS transistor 208 and nMOS transistor 210 are connected together, and further connected to one end of a capacitor 212, whose other end is connected to VSS. The inverter 206 and the capacitor 212 can be viewed collectively as a voltage divider module with the capacitor 212 connected between VSS and the output of the inverter 206. As will be explained more below, the current controlled inverter is used as a mechanism for determining the lock condition. The capacitor 212, across which the voltage is an indication voltage Vsum, is also connected to a Schmitt trigger 214, which is further connected to a buffer 216. The output of buffer 216 is a lock signal 218. It is, however, understood by those skilled in the art that the Schmitt trigger 214 may be substituted with other voltage comparators, while the buffer 216 may be optional, depending on the overall PLL circuit design.

Figure 3:
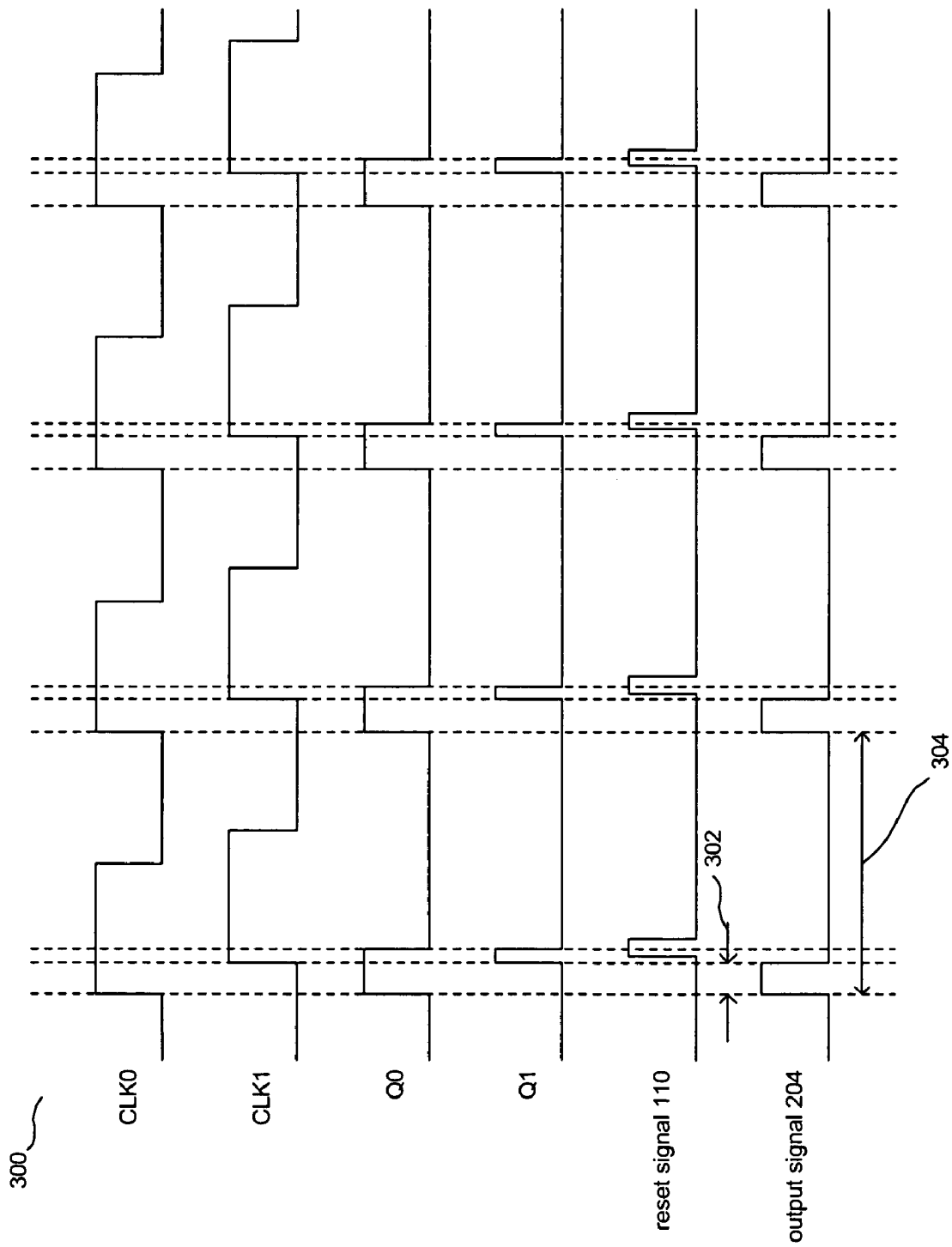
FIG. 3 illustrates a timing diagram in accordance with one example of the present disclosure.

FIG. 3 illustrates a timing diagram 300 when CLK0 and CLK1 are turned on. With reference to both FIGS. 2 and 3, output signal 204 is initially low because both Q0 and Q1 are low. When Q0 goes high due to a rising edge of CLK0, output signal 204 goes high since Q0 is high and Q1 remains low. Thereafter, when Q1 goes high due to a rising edge of CLK1, output signal 204 goes low since both Q0 and Q1 are high. Therefore, the pulse width of output signal 204, as represented by 302, is the phase difference between CLK0 and CLK1. After CLK1 goes high, Q0 and Q1 are reset after some delays and output signal 204 will remain low until the next clock cycle. A pulse train is formed on output signal 204, with the pulse width equal to the phase difference between CLK0 and CLK1, and a cycle equal to the cycle of CLK0.

With reference to both FIGS. 2 and 3, when output signal 204 is high, the capacitor 212 is discharging through nMOS transistor 210 of the current controlled inverter 206. When output signal 204 is low, the capacitor 212 is charging through the pMOS transistor 208 of the current controlled inverter 206. Therefore, the capacitor voltage Vsum is proportional to the pulse width of output signal 204, as represented by 302, relative to its cycle, as represented by 304. As the phase difference decreases, the pulse width of output signal 204 decreases, thereby allowing less time to discharge and more time to charge the capacitor 212, and resulting in a higher capacitor voltage Vsum. Similarly, as the phase difference increases, the pulse width of output signal 204 increases, thereby allowing more time to discharge and less time to charge the capacitor 212, causing a lower capacitor voltage Vsum.

As illustrated above, when the two clocks are adjusted closer to each other to a certain extent, the pulse width of output signal 204 decreases, and the pMOS transistor 208 of the current controlled inverter 206 sources more current to the capacitor 212 than the nMOS transistor 210 drains, thereby putting Vsum at a value higher than a predetermined threshold to indicate that the two clocks are "locked." Similarly, when the two clocks are parted farther than an allowed distance, the pMOS transistor 208 of the current controlled inverter 206 sources less current to the capacitor 212 than the nMOS transistor 210 drains, thereby putting Vsum at a value lower than a predetermined threshold to indicate that the two clocks are "unlocked."

By adjusting the turn-on voltage of the Schmitt trigger relative to the capacitor voltage Vsum, a lock condition relative to the maximum phase difference, or maximum phase error, may be adjusted. When the phase difference between the clocks is small, the capacitor voltage Vsum is higher than the turn-on voltage of the Schmitt trigger, which in turn generates a high signal on lock signal 218. Similarly, when the phase difference between the clocks is large, the capacitor voltage Vsum is lower than the turn-on voltage of the Schmitt trigger, thereby failing to turn on the Schmitt trigger, which in turn generates a low signal on lock signal 218.

The relationship between Vsum and VDD, which is connected to the current controlled inverter 206, is as follows:

$$V\text{sum}/VDD = I_H * (T_{C0} - T_{PT}) - I_L * T_{PT} / (I_H * T_{C0}) \quad (1)$$

where $I_H$ is the charging current going through the pMOS transistor 208, which is determined by the size of pMOS transistor 208, its gate voltage and its gain. IL is the discharging current going through the nMOS transistor 210, which is determined by the size of nMOS transistor 210, its gate voltage and its gain, $T_{C0}$ is the clock cycle of CLK0, and $T_{PT}$ is the pulse width of the pulse train at output signal 204. It is understood that the relationship between the charging current and the discharging current can be determined based on the specifications of the inverter 206 and the capacitor 212. Simply speaking, $I_L = A * I_H$ wherein A is a fixed factor for any specific circuit.

If the current sources are used, $I_H$ is generated by the current source $I_H$, and is the charging current that goes through the pMOS transistor 208, and $I_L$, which is generated by the current source IL, is the discharging current that goes through the nMOS transistor 210. $T_{C0}$ is the clock cycle of CLK0, and $T_{PT}$ is the pulse width of the pulse train at output signal 204. Since Equation 1 decides the condition of "lock", it can be said that the same condition may be decided simply by adjusting $I_H$ and $I_L$.

An example utilizing Equation 1 to calculate the turn-on voltage of the Schmitt trigger is presented with the following assumptions:

(i) Maximum phase error=1 percent;

(ii) VDD=3 volts $\quad$ (2); and (iii) $I_L = 49 * I_H$ $\quad$ (3)

and the calculations are as follows: Since the maximum phase error is 1 percent, the ratio $T_{PT}/T_{C0}$ is 0.01, and the relation between $T_{PT}$ and $T_{C0}$ is $$100 * T_{PT} = T_{C0} \quad (4)$$

By substituting Equations 2, 3 and 4 into Equation 1, Vsum under these conditions is the turn on voltage of the Schmitt trigger Vth, and can be ascertained:

$$Vth=((I_H*(100*T_{PT}-T_{PT})-49*T_{PT})/(I_H*100*T_{PT}))*3 \text{ volts}=1.5 \text{ volts}$$

Therefore, the turn-on voltage of the Schmitt trigger should be set to 1.5 volts with conditions as described in Equations 2 and 3 to produce a lock signal when phase error exceeds the maximum phase error of 1 percent. As it is understood, once the maximum phase error of, the supply voltage Vdd are determined according to the design of the PLL circuit, the turn-on voltage of the Schmitt trigger Vth can be easily programmed. The capacitor 212 and the inverter 206 can then be determined to make sure that Vsum fluctuates according to the phase error.

The above disclosure provides many different embodiments, or examples, for implementing different features of the disclosure. Specific examples of components, and processes are described to help clarify the disclosure. These are, of course, merely examples and are not intended to limit the disclosure from that described in the claims.

Although illustrative embodiments of the disclosure have been shown and described, other modifications, changes, and substitutions are intended in the foregoing disclosure. Accordingly, it is appropriate that the appended claims be construed broadly and in a manner consistent with the scope of the disclosure, as set forth in the following claims.

What is claimed is:

1. A clock lock detection circuit comprising:
   a first input indicating an edge of a clock;
   a second input indicating a corresponding edge of a second clock wherein the second clock is expected to be synchronized with the first clock with an allowable time difference;
   a difference generation module for generating a difference signal based on the time difference between the first and second inputs, wherein the difference generation module is an XOR gate; and
   a voltage divider module having a CMOS inverter for receiving the difference signal and generating an indication voltage which varies based on a change of the time difference between the first and second inputs.

2. The circuit of claim 1, wherein the voltage divider module further comprises a capacitor, wherein the inverter has first and second supply voltages with the capacitor connected to the second supply voltage and an output of the CMOS inverter.

3. The circuit of claim 1 further comprising a voltage comparator for comparing the indication voltage against a predetermined threshold voltage for generating a lock signal indicating whether the time difference is within the allowable time difference.

4. The circuit of claim 3 wherein the voltage comparator is a Schmitt trigger.

5. The circuit of claim 3 further comprising a buffer module passing the lock signal.

6. A clock lock detection circuit comprising:
   a first input indicating an edge of a first clock;
   a second input indicating a corresponding edge of a second clock wherein the second clock is expected to be synchronized with the first clock with an allowable time difference;
   a difference generation module for generating a difference signal based on the time difference between the first and second inputs, wherein the difference generation module is an XOR gate;
   a voltage divider module containing a capacitor for receiving the difference signal and generating an indication voltage which varies due to a charging and discharging process of the capacitor influenced by a change of the time difference between the first and second inputs; and
   a voltage comparator for comparing the indication voltage against a predetermined threshold voltage for generating a lock signal indicating whether the time difference is within the allowable time difference.

7. The circuit of claim 6, wherein the voltage divider module has a CMOS inverter and a capacitors, wherein the inverter has first and second supply voltages with the capacitor connected to the second supply voltage and an output of the CMOS inverter.

8. The circuit of claim 6, wherein the voltage comparator is a Schmitt trigger.

9. The circuit of claim 6, further comprising a buffer module passing the lock signal.

10. A method for detecting whether two clock signals have an allowable time difference, the method comprising:
    generating a first signal indicating an edge of a first clock;
    generating a second signal indicating a corresponding edge of a second clock wherein the edge of the second clock is expected to be close to the edge of the first clock within an allowable time difference;
    generating a difference signal based on the time difference between the first and second signals, wherein the generating of a difference signal further includes feeding the first and second signals to an XOR gate for generating the difference signal;
    feeding the difference signal into a voltage divider module having a CMOS inverter; and
    generating an indication voltage which varies based on a change of the time difference between the first and second signals.

11. The method of claim 10, wherein the voltage divider module further has a capacitor, wherein the inverter has first and second supply voltages with the capacitor connected to the second supply voltage and an output of the CMOS inverter and, wherein the indication voltage is the output of the CMOS inverter.

12. The method of claim 10, further comprising comparing the indication voltage against a predetermined threshold voltage for generating a lock signal indicating whether the time difference between the first and second signals is within the allowable time difference.

13. The method of claim 12, wherein the step of comparing the indication voltage against a predetermined threshold voltage further comprises feeding the indication voltage into a Schmitt trigger.

14. The method of claim 12, further comprising passing the lock signal through a buffer module.

15. A phase lock loop circuit, comprising:
    a first flip-flop receiving a first clock and generating a first signal indicating an edge of the first clock;
    a second flip-flop receiving a second clock and generating a second signal indicating a corresponding edge of the second clock wherein the edge of the second clock is expected to be close to the edge of the first clock within an allowable time difference;
    a reset signal generator using the first and second signals to generate a reset signal for the first and second flip-flops; and
    a clock lock detection circuit comprising:
        a difference generation module for generating a difference signal based on the time difference between the first and second signals, wherein the difference generation module is an XOR gate a voltage divider module containing a capacitor for receiving the difference signal and generating an indication voltage which varies due to a charging and discharging process of the capacitor influenced by a change of the time difference between the first and second signals; and a voltage comparator for comparing the indication voltage against a predetermined threshold voltage for generating a lock signal indicating whether the time difference is within the allowable time difference.

16. The circuit of claim 15, wherein the voltage divider module has a CMOS inverter and a capacitor, wherein the inverter has first and second supply voltages with the capacitor connected to the second supply voltage and an output of the CMOS inverter.

17. The circuit of claim 15, wherein the voltage divider module has a CMOS inverter and a capacitor wherein the inverter has first and second supply voltages with the capacitor connected to the second supply voltage and an output of the CMOS inverter.

* * * * *

UNITED STATES PATENT AND TRADEMARK OFFICE
CERTIFICATE OF CORRECTION

| | | |
|---|---|---|
| PATENT NO. | : 7,227,386 B2 | Page 1 of 1 |
| APPLICATION NO. | : 10/792006 | |
| DATED | : June 5, 2007 | |
| INVENTOR(S) | : Chung-Hui Chen | |

It is certified that error appears in the above-identified patent and that said Letters Patent is hereby corrected as shown below:

Column 6, line 12, delete "capacitors," and insert therefore -- capacitor -- .

Signed and Sealed this

Twenty-third Day of October, 2007

JON W. DUDAS
*Director of the United States Patent and Trademark Office*